(12) United States Patent
Alzheimer

(10) Patent No.: US 10,712,389 B2
(45) Date of Patent: *Jul. 14, 2020

(54) SCAN CHAIN OPERATIONS

(71) Applicant: Micron Technology, Inc., Boise, ID (US)

(72) Inventor: Joshua E. Alzheimer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/221,233

(22) Filed: Dec. 14, 2018

(65) Prior Publication Data

US 2019/0120902 A1 Apr. 25, 2019

Related U.S. Application Data

(62) Division of application No. 15/672,512, filed on Aug. 9, 2017, now Pat. No. 10,162,005.

(51) Int. Cl.
*G11C 29/00* (2006.01)
*G01R 31/3185* (2006.01)
(Continued)

(52) U.S. Cl.
CPC . *G01R 31/318547* (2013.01); *G01R 31/3177* (2013.01); *G01R 31/31727* (2013.01);
(Continued)

(58) Field of Classification Search
None
See application file for complete search history.

(56) References Cited

U.S. PATENT DOCUMENTS

| 4,380,046 A | 4/1983 | Fung |
| 4,435,792 A | 3/1984 | Bechtolsheim |

(Continued)

FOREIGN PATENT DOCUMENTS

| CN | 102141905 | 8/2011 |
| EP | 0214718 | 3/1987 |

(Continued)

OTHER PUBLICATIONS

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

(Continued)

*Primary Examiner* — Mujtaba M Chaudry
(74) *Attorney, Agent, or Firm* — Brooks, Cameron & Huebsch, PLLC

(57) ABSTRACT

A number of embodiments include an apparatus comprising a memory array including a first memory bank and a second memory bank and a serializer/de-serializer coupled to the first memory bank and the second memory bank. The serializer/de-serializer may be configured to receive a scan vector from the first memory bank, send the scan vector to a device under test, receive scan test responses from the device under test, and send the scan test responses to the second memory bank. Scan control logic may be coupled to the serializer/de-serializer and the device under test. The scan control logic may be configured to control operation of the serializer/de-serializer and send a scan chain control signal to the device under test, wherein the scan chain control signal is to initiate performance of a scan chain operation using the scan vector.

21 Claims, 4 Drawing Sheets

(51) Int. Cl.

| | |
|---|---|
| *G01R 31/3177* | (2006.01) |
| *G01R 31/317* | (2006.01) |
| *G06F 13/40* | (2006.01) |
| *G11C 29/12* | (2006.01) |
| *G11C 29/32* | (2006.01) |
| G11C 29/48 | (2006.01) |
| G11C 29/16 | (2006.01) |

(52) U.S. Cl.
CPC ..... *G01R 31/318563* (2013.01); *G06F 13/40* (2013.01); *G11C 29/1201* (2013.01); *G11C 29/12015* (2013.01); *G11C 29/32* (2013.01); G11C 29/16 (2013.01); G11C 29/48 (2013.01)

(56) References Cited

U.S. PATENT DOCUMENTS

| | | | |
|---|---|---|---|
| 4,435,793 A | 3/1984 | Ochii | |
| 4,727,474 A | 2/1988 | Batcher | |
| 4,843,264 A | 6/1989 | Galbraith | |
| 4,891,809 A | 1/1990 | Hazawa | |
| 4,958,378 A | 9/1990 | Bell | |
| 4,977,542 A | 12/1990 | Matsuda et al. | |
| 5,023,838 A | 6/1991 | Herbert | |
| 5,034,636 A | 7/1991 | Reis et al. | |
| 5,201,039 A | 4/1993 | Sakamura | |
| 5,210,850 A | 5/1993 | Kelly et al. | |
| 5,253,308 A | 10/1993 | Johnson | |
| 5,276,643 A | 1/1994 | Hoffmann et al. | |
| 5,325,519 A | 6/1994 | Long et al. | |
| 5,341,382 A | 8/1994 | Levitt | |
| 5,349,587 A | 9/1994 | Nadeau-Dostie et al. | |
| 5,367,488 A | 11/1994 | An | |
| 5,379,257 A | 1/1995 | Matsumura et al. | |
| 5,383,143 A | 1/1995 | Crouch et al. | |
| 5,386,379 A | 1/1995 | Ali-Yahia et al. | |
| 5,398,213 A | 3/1995 | Yeon et al. | |
| 5,414,714 A | 5/1995 | Gladden | |
| 5,440,482 A | 8/1995 | Davis | |
| 5,446,690 A | 8/1995 | Tanaka et al. | |
| 5,473,576 A | 12/1995 | Matsui | |
| 5,481,500 A | 1/1996 | Reohr et al. | |
| 5,485,373 A | 1/1996 | Davis et al. | |
| 5,506,811 A | 4/1996 | McLaury | |
| 5,550,843 A | 8/1996 | Yee | |
| 5,615,404 A | 3/1997 | Knoll et al. | |
| 5,638,128 A | 6/1997 | Hoogenboom | |
| 5,638,317 A | 6/1997 | Tran | |
| 5,654,936 A | 8/1997 | Cho | |
| 5,678,021 A | 10/1997 | Pawate et al. | |
| 5,724,291 A | 3/1998 | Matano | |
| 5,724,366 A | 3/1998 | Furutani | |
| 5,751,987 A | 5/1998 | Mahant-Shetti et al. | |
| 5,787,458 A | 7/1998 | Miwa | |
| 5,854,636 A | 12/1998 | Watanabe et al. | |
| 5,867,429 A | 2/1999 | Chen et al. | |
| 5,870,504 A | 2/1999 | Nemoto et al. | |
| 5,915,084 A | 6/1999 | Wendell | |
| 5,935,263 A | 8/1999 | Keeth et al. | |
| 5,986,942 A | 11/1999 | Sugibayashi | |
| 5,991,209 A | 11/1999 | Chow | |
| 5,991,785 A | 11/1999 | Alidina et al. | |
| 6,005,799 A | 12/1999 | Rao | |
| 6,009,020 A | 12/1999 | Nagata | |
| 6,070,255 A | 5/2000 | Dell et al. | |
| 6,092,186 A | 7/2000 | Betker et al. | |
| 6,122,211 A | 9/2000 | Morgan et al. | |
| 6,125,071 A | 9/2000 | Kohno et al. | |
| 6,134,164 A | 10/2000 | Lattimore et al. | |
| 6,147,514 A | 11/2000 | Shiratake | |
| 6,151,244 A | 11/2000 | Fujino et al. | |
| 6,157,578 A | 12/2000 | Brady | |
| 6,163,862 A | 12/2000 | Adams et al. | |
| 6,166,942 A | 12/2000 | Vo et al. | |
| 6,172,918 B1 | 1/2001 | Hidaka | |
| 6,175,514 B1 | 1/2001 | Henderson | |
| 6,181,698 B1 | 1/2001 | Hariguchi | |
| 6,208,544 B1 | 3/2001 | Beadle et al. | |
| 6,226,215 B1 | 5/2001 | Yoon | |
| 6,301,153 B1 | 10/2001 | Takeuchi et al. | |
| 6,301,164 B1 | 10/2001 | Manning et al. | |
| 6,304,477 B1 | 10/2001 | Naji | |
| 6,389,507 B1 | 5/2002 | Sherman | |
| 6,418,498 B1 | 7/2002 | Martwick | |
| 6,466,499 B1 | 10/2002 | Blodgett | |
| 6,510,098 B1 | 1/2003 | Taylor | |
| 6,563,754 B1 | 5/2003 | Lien et al. | |
| 6,578,058 B1 | 6/2003 | Nygaard | |
| 6,731,542 B1 | 5/2004 | Le et al. | |
| 6,754,746 B1 | 6/2004 | Leung et al. | |
| 6,768,679 B1 | 7/2004 | Le et al. | |
| 6,807,614 B2 | 10/2004 | Chung | |
| 6,816,422 B2 | 11/2004 | Hamade et al. | |
| 6,819,612 B1 | 11/2004 | Achter | |
| 6,894,549 B2 | 5/2005 | Eliason | |
| 6,943,579 B1 | 9/2005 | Hazanchuk et al. | |
| 6,948,056 B1 | 9/2005 | Roth | |
| 6,950,771 B1 | 9/2005 | Fan et al. | |
| 6,950,898 B2 | 9/2005 | Merritt et al. | |
| 6,956,770 B2 | 10/2005 | Khalid et al. | |
| 6,961,272 B2 | 11/2005 | Schreck | |
| 6,965,648 B1 | 11/2005 | Smith et al. | |
| 6,985,394 B2 | 1/2006 | Kim | |
| 6,987,693 B2 | 1/2006 | Cernea et al. | |
| 7,020,017 B2 | 3/2006 | Chen et al. | |
| 7,028,170 B2 | 4/2006 | Saulsbury | |
| 7,045,834 B2 | 5/2006 | Tran et al. | |
| 7,054,178 B1 | 5/2006 | Shiah et al. | |
| 7,061,817 B2 | 6/2006 | Raad et al. | |
| 7,079,407 B1 | 7/2006 | Dimitrelis | |
| 7,173,857 B2 | 2/2007 | Kato et al. | |
| 7,187,585 B2 | 3/2007 | Li et al. | |
| 7,196,928 B2 | 3/2007 | Chen | |
| 7,260,565 B2 | 8/2007 | Lee et al. | |
| 7,260,672 B2 | 8/2007 | Garney | |
| 7,372,715 B2 | 5/2008 | Han | |
| 7,400,532 B2 | 7/2008 | Aritome | |
| 7,406,494 B2 | 7/2008 | Magee | |
| 7,447,720 B2 | 11/2008 | Beaumont | |
| 7,454,451 B2 | 11/2008 | Beaumont | |
| 7,457,181 B2 | 11/2008 | Lee et al. | |
| 7,535,769 B2 | 5/2009 | Cernea | |
| 7,546,438 B2 | 6/2009 | Chung | |
| 7,562,198 B2 | 7/2009 | Noda et al. | |
| 7,574,466 B2 | 8/2009 | Beaumont | |
| 7,602,647 B2 | 10/2009 | Li et al. | |
| 7,663,928 B2 | 2/2010 | Tsai et al. | |
| 7,685,365 B2 | 3/2010 | Rajwar et al. | |
| 7,692,466 B2 | 4/2010 | Ahmadi | |
| 7,752,417 B2 | 7/2010 | Manczak et al. | |
| 7,791,962 B2 | 9/2010 | Noda et al. | |
| 7,796,453 B2 | 9/2010 | Riho et al. | |
| 7,805,587 B1 | 9/2010 | Van Dyke et al. | |
| 7,808,854 B2 | 10/2010 | Takase | |
| 7,827,372 B2 | 11/2010 | Bink et al. | |
| 7,869,273 B2 | 1/2011 | Lee et al. | |
| 7,898,864 B2 | 3/2011 | Dong | |
| 7,924,628 B2 | 4/2011 | Danon et al. | |
| 7,937,535 B2 | 5/2011 | Ozer et al. | |
| 7,957,206 B2 | 6/2011 | Bauser | |
| 7,979,667 B2 | 7/2011 | Allen et al. | |
| 7,996,749 B2 | 8/2011 | Ding et al. | |
| 8,042,082 B2 | 10/2011 | Solomon | |
| 8,045,391 B2 | 10/2011 | Mohklesi | |
| 8,059,438 B2 | 11/2011 | Chang et al. | |
| 8,095,825 B2 | 1/2012 | Hirotsu et al. | |
| 8,117,462 B2 | 2/2012 | Snapp et al. | |
| 8,127,187 B2 * | 2/2012 | Xia .......................... | G06F 11/25 714/726 |
| 8,164,942 B2 | 4/2012 | Gebara et al. | |
| 8,208,328 B2 | 6/2012 | Hong | |
| 8,213,248 B2 | 7/2012 | Moon et al. | |
| 8,223,568 B2 | 7/2012 | Seo | |
| 8,238,173 B2 | 8/2012 | Akerib et al. | |

(56) References Cited

U.S. PATENT DOCUMENTS

| | | | |
|---|---|---|---|
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,499,209 B2 * | 7/2013 | Rajski | G01R 31/318575 714/741 |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,383,409 B2 | 7/2016 | Chen et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2002/0154536 A1 | 10/2002 | Perner |
| 2002/0162069 A1 | 10/2002 | Laurent |
| 2003/0005359 A1 * | 1/2003 | Magliocco | G01R 31/3183 714/25 |
| 2003/0056164 A1 | 3/2003 | Lauga |
| 2003/0065996 A1 | 4/2003 | Shimada et al. |
| 2003/0067043 A1 | 4/2003 | Zhang |
| 2003/0167426 A1 | 9/2003 | Slobodnik |
| 2003/0204795 A1 | 10/2003 | Adams et al. |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2009/0265596 A1 | 10/2009 | Chen et al. |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0313089 A1 * | 12/2010 | Rajski | G01R 31/318547 714/731 |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0117436 A1 * | 5/2012 | Portolan | G01R 31/318314 714/738 |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0318410 A1 | 11/2013 | Jun et al. |
| 2013/0326154 A1 | 12/2013 | Haswell |
| 2013/0332707 A1 | 12/2013 | Gueron et al. |
| 2014/0149812 A1 * | 5/2014 | Tekumalla | G01R 31/318555 714/727 |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0120987 A1 | 4/2015 | Wheeler |
| 2015/0134713 A1 | 5/2015 | Wheeler |
| 2015/0212151 A1 * | 7/2015 | Picalausa | G01R 31/318544 714/727 |
| 2015/0270015 A1 | 9/2015 | Murphy et al. |
| 2015/0279466 A1 | 10/2015 | Manning |

(56) References Cited

U.S. PATENT DOCUMENTS

| | | |
|---|---|---|
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0098208 A1 | 4/2016 | Willcock |
| 2016/0098209 A1 | 4/2016 | Leidel et al. |
| 2016/0110135 A1 | 4/2016 | Wheeler et al. |
| 2016/0125919 A1 | 5/2016 | Hush |
| 2016/0154596 A1 | 6/2016 | Willcock et al. |
| 2016/0155482 A1 | 6/2016 | La Fratta |
| 2016/0169966 A1* | 6/2016 | Abshishek ..... G01R 31/318541 714/727 |
| 2016/0188250 A1 | 6/2016 | Wheeler |
| 2016/0196142 A1 | 7/2016 | Wheeler et al. |
| 2016/0196856 A1 | 7/2016 | Tiwari et al. |
| 2016/0225422 A1 | 8/2016 | Tiwari et al. |
| 2016/0266873 A1 | 9/2016 | Tiwari et al. |
| 2016/0266899 A1 | 9/2016 | Tiwari |
| 2016/0267951 A1 | 9/2016 | Tiwari |
| 2016/0292080 A1 | 10/2016 | Leidel et al. |
| 2016/0306584 A1 | 10/2016 | Zawodny et al. |
| 2016/0306614 A1 | 10/2016 | Leidel et al. |
| 2016/0365129 A1 | 12/2016 | Willcock |
| 2016/0371033 A1 | 12/2016 | La Fratta et al. |
| 2017/0052906 A1 | 2/2017 | Lea |
| 2017/0178701 A1 | 6/2017 | Willcock et al. |
| 2017/0192844 A1 | 7/2017 | Lea et al. |
| 2018/0038910 A1 | 2/2018 | Kawoosa et al. |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Kogge, et al., "Processing In Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

International Search Report and Written Opinion for PCT Application No. PCT/US2013/043702, dated Sep. 26, 2013, (11 pgs.).

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

Pagiamtzis, Kostas, "Content-Addressable Memory Introduction", Jun. 25, 2007, (6 pgs.), retrieved from: http://www.pagiamtzis.com/cam/camintro.

Debnath, Biplob, Bloomflash: Bloom Filter on Flash-Based Storage, 2011 31st Annual Conference on Distributed Computing Systems, Jun. 20-24, 2011, 10 pgs.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Stojmenovic, "Multiplicative Circulant Networks Topological Properties and Communication Algorithms", (25 pgs.), Discrete Applied Mathematics 77 (1997) 281-305.

Boyd et al., "On the General Applicability of Instruction-Set Randomization", Jul.-Sep. 2010, (14 pgs.), vol. 7, Issue 3, IEEE Transactions on Dependable and Secure Computing.

Elliot, et al., "Computational RAM: Implementing Processors in Memory", Jan.-Mar. 1999, (10 pgs.), vol. 16, Issue 1, IEEE Design and Test of Computers Magazine.

* cited by examiner

SCAN CHAIN OPERATIONS

PRIORITY INFORMATION

This application is a Divisional of U.S. application Ser. No. 15/672,512, filed Aug. 9, 2017, which issues as U.S. Pat. No. 10,162,005 on Dec. 25, 2018, the contents of which are included herein by reference.

TECHNICAL FIELD

The present disclosure relates generally to semiconductor memory and methods, and more particularly, to apparatuses and methods related to scan chain operations.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and a combinatorial logic block, for example, which can be used to execute instructions by performing logical operations such as AND, OR, NOT, NAND, NOR, and XOR logical operations on data (e.g., one or more operands). For example, functional unit circuitry may be used to perform arithmetic operations such as addition, subtraction, multiplication, and division on operands via a number of logical operations in addition to scan chain operations.

A number of components in an electronic system may be involved in providing instructions to the functional unit circuitry for execution. The instructions may be executed, for instance, by a processing resource such as a controller and/or host processor. Data (e.g., the operands on which the instructions will be executed) may be stored in a memory array that is accessible by the functional unit circuitry. The instructions and data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and data may also be sequenced and/or buffered.

DETAILED DESCRIPTION

Figure 1:
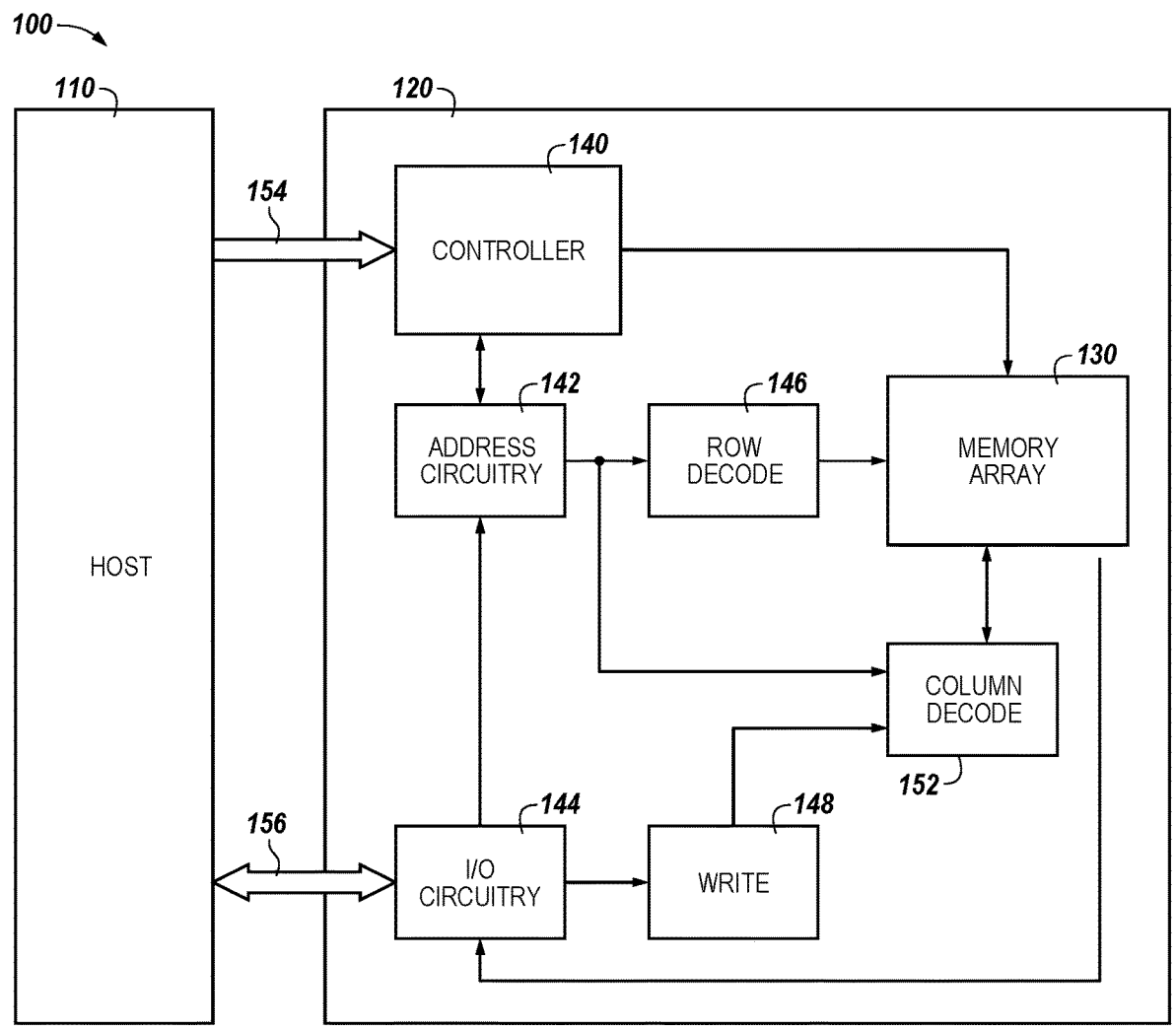
FIG. 1 is a block diagram of an apparatus in the form of a computing system including a memory device in accordance with a number of embodiments of the present disclosure.

The present disclosure includes apparatuses and methods related to scan chain operations. A number of embodiments include an apparatus comprising a memory array including a first memory bank and a second memory bank and a serializer/de-serializer coupled to the first memory bank and the second memory bank. The serializer/de-serializer may be configured to receive a scan vector from the first memory bank, send the scan vector to a device under test, receive scan test responses from the device under test, and send the scan test responses to the second memory bank. Scan control logic may be coupled to the serializer/de-serializer and the device under test. The scan control logic may be configured to control operation of the serializer/de-serializer and send a scan chain control signal to the device under test, wherein the scan chain control signal is to initiate performance of a scan chain operation using the scan vector. As used herein, a "scan vector" or "scan chain vector" is a physically contiguous number of bits that can be stored, shifted, read, and/or written to and/or from a memory device and/or device under test.

Scan chain testing may be used to detect various manufacturing faults in an electronic system. Such faults may include shorts and opens exhibited in components associated with the electronic system. Scan chain testing may be desirable to minimize the chance of selling or shipping a defective part to a customer, which could not only result in a loss of good will toward the manufacturer or reseller of the defective part, but may also have more dire consequences, for example in the case of electronic systems for automotive or medical applications.

In some approaches, a flip-flop is coupled via its input to a multiplexer. One input of the multiplexer may act as a functional input, while the other input of the multiplexer may be a scan-in input. A scan enable signal may be provided to the multiplexer to select between the functional input and the scan-in input. The output of the flip-flop is coupled to another multiplexer that is coupled to another flip-flop in the same manner as described above. Accordingly, a plurality of flip-flops may be connected together via a plurality of multiplexers to form a chain, which may effectively act as a shift register.

In such approaches, the first flip-flop of the chain is coupled to a scan-in port, and the last flip-flop of the chain is coupled to a scan-out port. In general, a clock signal is provided to each flip-flop in the chain. The clock signal may be provided to each flip-flop to coordinate transfer of data from one flip-flop to the next flip-flop in the chain.

In contrast, a number of embodiments of the present disclosure can utilize a native datapath and a serializer/de-serializer to transfer data to and from a memory array to a device under test in a more efficient manner as compared to previous approaches. For example, scan vectors may be stored in the memory array and subsequently transferred through a native datapath to a device under test. A resultant scan vector may then be transferred from the device under test back to the memory array. Further, various embodiments can utilize a native datapath and a serializer/de-serializer to transfer data into and/or out of periphery logic as part of performing a scan chain operation.

As used herein, a "native datapath" is a data path which allows data to be written to and read from specific memory locations. The native datapath may allow for bidirectional transfer of data to and from the specific memory locations. In some embodiments, the native datapath may include sense amplifier, input/output (I/O) devices, multiplexers, write drivers, and/or data amplifiers. Some of the circuits of the native datapath may be truly bidirectional (e.g., they may pass data in for write operations and out for read operations), while some of the circuits of the native datapath may be unidirectional but occurring in complementary pairs such that data can be transferred bidirectionally.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, designators such as "N," particularly with respect to reference numerals in the drawings, indicate that a number of the particular feature so designated can be included. As used herein, "a number of" a particular thing can refer to one or more of such things (e.g., a number of memory arrays can refer to one or more memory arrays). A "plurality of" is intended to refer to more than one of such things.

The figures herein follow a numbering convention in which the first digit or digits correspond to the drawing figure number and the remaining digits identify an element or component in the drawing. Similar elements or components between different figures may be identified by the use of similar digits. For example, 130 may reference element "30" in FIG. 1, and a similar element may be referenced as 330 in FIG. 3. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, controller 140, and memory array 130 might also be separately considered an "apparatus."

System 100 includes a host 110 coupled (e.g., connected) to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines, which may be referred to herein as word lines or select lines, and columns coupled by sense lines, which may be referred to herein as data lines or digit lines. Although a single array 130 is shown in FIG. 1, embodiments are not so limited. For instance, memory device 120 may include a number of arrays 130 (e.g., a number of banks of DRAM cells, NAND flash cells, etc.).

The memory device 120 includes address circuitry 142 to latch address signals provided over a bus 156 through I/O circuitry 144 and/or to latch address signals provided over control bus 154. Address signals are received through address circuitry 142 and decoded by a row decoder 146 and a column decoder 152 to access the memory array 130. The I/O circuitry 144 can be used for bidirectional data communication with host 110 over the bus 156. The write circuitry 148 is used to write data to the memory array 130. In FIG. 1, bus 156 serves as a combined address/data bus; however, embodiments are not so limited. For example, a control bus, address bus, and/or data bus may be separate buses.

Controller 140, e.g., bank control logic and/or sequencer, decodes signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110 and sequencing access to the array 130. The controller 140 can be a state machine (e.g., hardware and/or firmware in the form of an application specific integrated circuit (ASIC)), a sequencer, or some other type of controller.

The controller 140 can control, for example, reading and writing scan vectors into and out of the memory array 130, and/or can control timing of scan chain operations performed on a scan vector. As used herein, a "scan chain operation" includes one or more of: receiving (e.g., scanning in, shifting in) an input scan vector, storing (e.g., capturing) the scan vector, and writing (e.g., scanning out, shifting out) the resultant scan vector out of a serializer/de-serializer and/or device under test. For example, according to embodiments, a scan vector can be loaded into a serializer/de-serializer and/or device under test. The scan vector can be stored, for example, by asserting a capture clock pulse, and the resultant scan vector can be shifted out of the serializer/de-serializer and/or device under test, for example, to a portion of the memory array 130.

Figure 2:
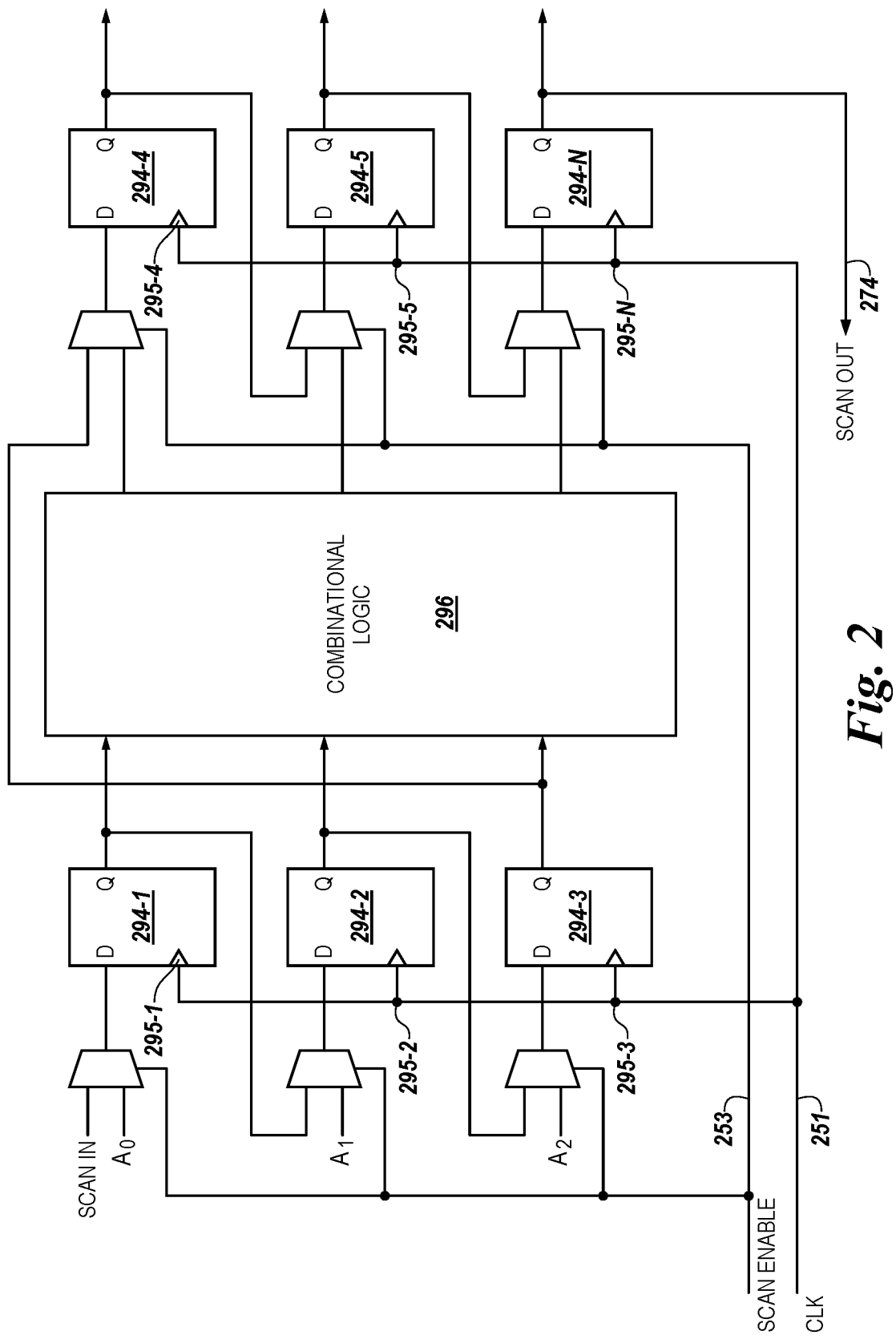
FIG. 2 is a prior art block diagram of an apparatus for performing scan chain operations in a computing system in accordance with a number of previous approaches to scan chain testing.

FIG. 2 is a prior art block diagram of an apparatus for performing scan chain operations in a computing system in accordance with some previous approaches to scan chain testing. Scan chain testing can be used to set and observe storage elements in a piece of hardware, for example. By setting and observing storage elements in a scan, internal nodes of a piece of hardware can be tested. In the previous approach shown in FIG. 2, a scan chain is formed by a plurality of flip-flops 294-1, 294-2, . . . , 294-N. Each of the flip-flops 294-1, 294-2, . . . , 294-N can include a data input D, a data output Q, and/or clock signal input 295-1, 295-2, . . . , 295-N. In some embodiments, the flip-flops 294-1, 294-2, . . . , 294-N can be serially coupled to form the scan chain. That is, the plurality of flip-flops 294-1, 294-2, . . . , 294-N can be configured for use in scan chain testing. For example, a data input D of a respective storage element (e.g., 294-2) is coupled to data output Q of a preceding storage element (e.g., 294-1).

Scan testing may be done using the apparatus shown in FIG. 2 in order to detect manufacturing faults in the combinational logic 296. In order to do so, nodes within the combinational logic 296 may be excited by applying input vectors at the flip-flops of the scan chain. At the beginning of a scan testing operation, a scan enable signal may be asserted on scan enable signal line 253. Responsive to assertion of the scan enable signal, data may be shifted in to each of the flip-flops 294-1, . . . , 294-N such that the flip-flops 294-1, . . . , 294-N are loaded with an input vector. Subsequently, a clock pulse may be asserted on CLK signal line 251 to excite the combinational logic 296. The output is then captured and compared to an expected signature to determine if there are manufacturing faults in the combinational logic 296.

Figure 3:
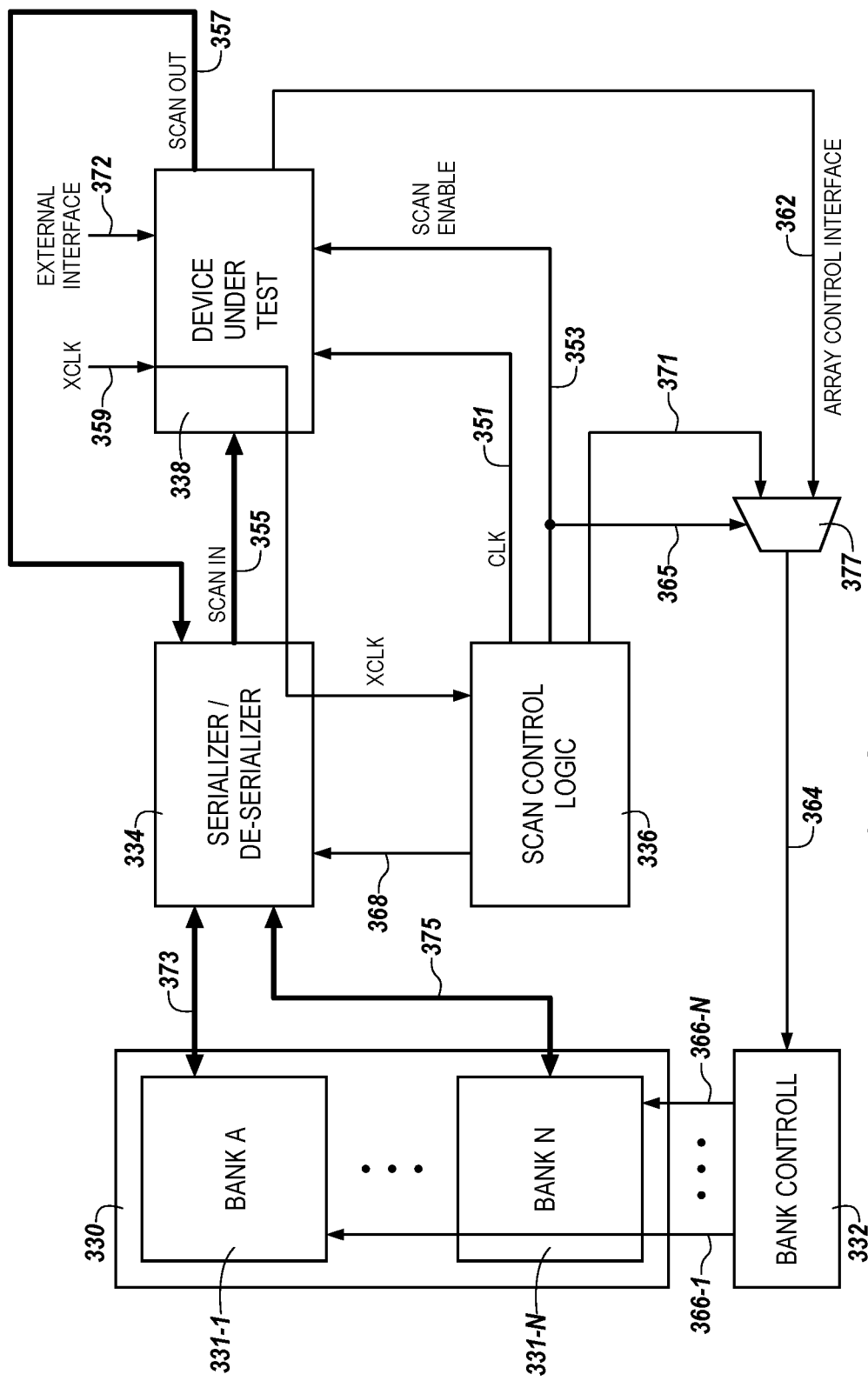
FIG. 3 is a block diagram of an apparatus for performing scan chain operations in a computing system in accordance with a number of embodiments of the present disclosure.

FIG. 3 is a block diagram of an apparatus for performing scan chain operations in a computing system in accordance with a number of embodiments of the present disclosure. As shown in FIG. 3, a memory array 330 may include a plurality of memory banks 331-1 (Bank A), . . . , 331-N (Bank N), which may be coupled to a serializer/de-serializer 334 via native data paths 373 and 375. The native datapaths 373 and 375 may include functional units (e.g., arithmetic logic units, multipliers, etc. to perform data processing operations), registers, and/or buses. In some embodiments, the native datapaths may be DRAM or DDR data paths configured to allow data transfer between specific locations of the memory.

The native datapaths 373 and 375 may be used to transfer data from the memory array 330 to the serializer/de-serializer 334 and from the serializer/de-serializer 334 to the memory array 330. In some embodiments, native datapath 373 may be used to transfer a scan vector from memory bank 331-1 of the memory array 330 to the serializer/de-serializer 334, while native datapath 375 may be used to transfer a scan vector (e.g., a resultant scan vector as described in more detail, herein) from the serializer/de-serializer 334 to another memory bank 331-N of the memory array 330.

The serializer/de-serializer 334 may include logic and/or a plurality of data (DQ) pins. Bidirectional data signals may be sent and/or received via the DQ. In some embodiments, the serializer/de-serializer 334 may include parallel-to-serial converters and/or serial-to-parallel converters to serialize or de-serialize data received or sent by the serializer/de-serializer 334. For example, the serializer/de-serializer 334 may be configured to read data (e.g., receive data) in parallel (e.g., using the DQ pins) from the memory array 330 and convert the data to a serial data stream. Similarly, the serializer/de-serializer may be configured to convert the serial data into parallel data and write the data (e.g., send the data) in parallel (e.g., using the DQ pins) to a device under test 338. The device under test 338 may be any electronic assembly that is testable using scan insertion techniques. In some embodiments, the serializer/de-serializer 334 may receive serial data from the device under test 338 (e.g., a resultant serial scan vector), convert the data to parallel, and send the parallel data (e.g., the resultant parallelized scan vector) to the memory array 330. Parallel data may be transferred via native datapaths 373 and 375, and serial data may be transferred via SCAN IN path 355 and SCAN OUT path 357.

In some embodiments, native datapath 373 and/or native datapath 375 may be n-bit datapaths. For example, native datapath 373 and/or native datapath 375 may be capable of transferring n-bits of data in a given period of time. The serializer/de-serializer 334 may, in some embodiments, include m DQ pins and therefore may be capable of outputting an m-bit parallel word. In such examples, $$\frac{n}{2}$$

bits may be scanned into the device under test 338, and $$\frac{n}{2}$$

bits may be scanned out of the device under test 338 in $$\frac{m}{2}$$

parallel scan chains. That is, in some embodiments, the serializer/de-serializer 334 may be configured to send an $$\frac{n}{2}$$

bit scan vector to the device under test 338 via SCAN IN path 355, and receive an $$\frac{n}{2}$$

bit resultant scan vector output from the device under test 338 via SCAN OUT path 357.

In some embodiments, the datapath (e.g., native datapaths 373/375 and/or SCAN IN path 355/SCAN OUT path 357) may be modified such that half of the datapath (e.g., native data path 373 and/or SCAN IN path 355) may be used for writes and half of the datapath (e.g., native datapath 375 and/or SCAN OUT path 357) may be used for reads at any given time. For example, half of the datapath $$\left(e.g., \frac{n}{2} \text{ bits}\right)$$

may be used for writes concurrently with the other half of the datapath $$\left(e.g., \frac{n}{2} \text{ bits}\right)$$

being used for reads.

As an example, the memory array 330 may comprise a 4 Gb×8 DDR4 SDRAM memory device, which may have n=64 and m=8. In this example, the serializer/de-serializer 334 may include a 32-bit $$\left(\frac{n}{2}\right)$$

read bus (e.g., may include 4 input DQ pins by 8 burst bits) and a 32-bit $$\left(\frac{n}{2}\right)$$

write bus (e.g., may include 4 output DQ pins by 8 burst bits) with $$4\left(\frac{m}{2}\right)$$

parallel scan chains. Embodiments are not so limited; however. Although described above in connection with a DDR4 SDRAM device, the memory array 330 may include a DDR2, DDR3, or other suitable DRAM memory device.

In some embodiments, scan control logic 336 is configured to control which half of a word (e.g., which $$\frac{n}{2}$$

bit portion of an n-bit word) is used for writes and which half of the word is used for reads. For example, scan control logic 336 may be configured to control which 32-bit portion of a 64-bit word is used for writes and which 32-bit portion of the 64-bit word is used for reads. In some embodiments, a first $$\frac{n}{2}$$

bit portion of the word may be a scan vector, and a second $$\frac{n}{2}$$

bit portion of the word may be a resultant scan vector.

The serializer/de-serializer 334 may include circuitry to control operation of the serializer/de-serializer 334. For example, the serializer/de-serializer 334 may include driver and/or input buffers, parallel-to-serial and/or serial-to-parallel converters, circuitry for receiving data (e.g., scan vectors from memory array 330) and/or clock signals (e.g., external clock signal XCLK 359), and circuitry for receiving control signals (e.g., via scan control signal line 368) from the scan control logic 336.

In some embodiments, the serializer/de-serializer 334 is configured to transfer a scan vector via SCAN IN path 355, such as a scan vector received from the memory array 330 via native datapath 373, to the device under test 338. The serializer/de-serializer 334 may be configured to transfer the scan vector to the device under test 338 in response to receipt of a scan control signal from the scan control logic 336. The scan control signal may be sent from the scan control logic 336 to the serializer/de-serializer 334 via scan control signal line 368.

The scan control logic 336 may be provided on-chip and may be configured to control operation of the serializer/de-serializer 334 via scan control signals sent via scan control signal line 368. Scan control logic 336 may include an interface for interacting with the memory array 330 (e.g., via bank control 332), serializer/de-serializer 334, and/or device under test 338. For example, scan control logic 336 may include an interface that may be configured to control data movement (e.g., may control "steering" data into the scan chain) to facilitate performance of a scan chain operation. In some embodiments, the scan control logic 336 may keep track of which bit in the scan vector is currently be used in order to control timing (e.g., clocking) of the scan vector.

Scan control logic 336 may be configured to generate and assert various signals via scan control signal line 368, CLK signal line 351, read/write activation signal line 364, and scan enable signal line 353/365, etc. For example, scan control logic 336 may assert first-in-first-out (FIFO)/serializer/de-serializer/clocking signals via scan control signal line 368 to control the serializer/de-serializer 334 to perform various tasks and/or operations, as described above. In some embodiments, clock signals may be asserted on CLK signal line 351. For example, clock signals to control timing of performance of a scan chain operation may be asserted by the scan control logic 336 to the device under test 338 via CLK signal line 351.

A control signal to activate read and write operations for the memory array 330 may be asserted on read/write activation signal line 364. In some embodiments, the control signal to activate read and write operations for the memory array 330 may activate bank control 332, which is coupled to each bank in the memory array 330 via bank control signal lines 366-1, ..., 366-N. For example, responsive to receipt of the control signal to activate read and write operations for the memory array 330, bank control 332 may send additional control signals to banks 331-1, ..., 331-N of the memory array 330 to cause data to be read from the memory array 330 or written to the memory array 330.

In some embodiments, the scan control logic 336 may be configured to assert a scan enable signal on scan enable signal line 353/365 to enable a scan chain operation to be performed. When the scan enable signal is asserted on scan enable signal line 353/365, the scan control logic 336 may take over control of access of the memory array 330. By providing control of access to the memory array 330 to the scan control logic 336 responsive to assertion of the scan enable signal, the scan control logic 336 can coordinate operation of the serializer/de-serializer 334 as part of performing a scan chain operation on a scan vector.

Scan control logic 336 may include one or more state machines to access the memory array 330. The state machine(s) may be used to keep track of row and column addresses for data in the memory array 330 as scan vectors are transferred into or out of the memory array 330, for example to the serializer/de-serializer 334 and/or the device under test 338. In some embodiments, the state machine(s) may receive input from a register (e.g., a current bit register), which is not explicitly shown in FIG. 3, to select a next row of data to be used for a scan chain operation once the current row of data is exhausted.

The current bit register may be used to count (or keep track of) a bit in the scan vector that is currently being read from the memory array 330, scanned in (e.g., at 355) to the device under test 338, scanned out (e.g., at 357) of the device under test 338, and/or written to the memory array 330. The current bit register may be included in the scan control logic 336, or the current bit register may be located external to the scan control logic 336 so long as the current bit register is communicatively coupled to the scan control logic 336. The current bit register may be used as a counter when performing a scan chain operation on a scan vector. In some embodiments, when the current bit (as determined by the current bit register, for example) is the last bit in a scan vector (e.g., when current bit==vector length), the device under test 338 may be clocked and a next scan vector may be scanned in (e.g., loaded) into the device under test 338. This may occur during a "cycle machine" mode (e.g., cycle machine 463 illustrated and discussed in more detail in connection with FIG. 4, herein) of the scan chain operation.

In some embodiments, the scan control logic 336 may include other registers in addition to the current bit register. For example, the scan control logic 336 may include vector length register(s), number of tests register(s), test number register(s), etc. that may be used to control performance of the scan chain operation and/or may be used as part of preparing for performing a scan chain operation.

The vector length register(s) may be used to control the length of the scan vector. In the case of a 16 bit vector length register, there may be 64 pre-fetches, however, the vector length register may comprise more than 16 bits or fewer than 16 bits, which may alter the number of pre-fetches that may be performed. In the example where the memory array 330 is a DDR4 memory device, there may be 32 bits per pre-fetch, which may allow for a scan vector length of 2 Mb.

The number of tests register(s) may be used to determine how many scan vectors are to be scanned in (e.g., at 355) to the device under test 338 and have a scan chain operation performed thereon. In some embodiments, the number of tests register(s) may be 16 bits in length, however, the number of tests register(s) may comprise more than 16 bits or fewer than 16 bits, which may alter the number of scan vectors that may have a scan chain operation performed thereon.

The test number register(s) may be used to count (or keep track of) how many scan vectors are to be scanned in to the device under test 338 for scan chain operations and/or may count (or keep track of) how many scan vectors have already been scanned in to the device under test 338 for scan chain operations. When a threshold number of scan vectors have been scanned in to the device under test 338 for scan chain operations, the test number register(s) may cause performance of scan chain operations to stop. For example, when test number==number of tests, scan chain operations may be stopped. In some embodiments, the test number register(s) may be 16 bits in length, however, the test number register(s) may comprise more than 16 bits or fewer than 16 bits.

In some embodiments, the scan control logic 336 may include an interface to facilitate access to the registers. The scan control logic 336 may be programmed using a load mode register (LMR) command. For example, the scan control logic 336 may include address buses (e.g., a row address bus and a column address bus), which may be activated responsive to the LMR command, to facilitate access to the scan control logic 336 registers. In some embodiments, a test-mode LMR command may be received by the scan control logic 336 prior to loading data into the registers.

In some embodiments, the scan control logic 336 may issue commands (e.g., via its state machine(s)) to read data from the memory array 330 or write data to the memory array 330 until a current bit is the length of the scan vector (e.g., until a particular row of data is exhausted). Such commands may include commands to read data from a source memory bank (e.g., Bank A) of the memory array 330 and commands to write data to a destination memory bank (e.g., Bank B) of the memory array 330. Once the particular row of data is exhausted, the scan control logic 336 may close the particular row, open a new row of data, and continue issuing commands to the memory array to read the new row of data from the memory array 330 or write a new row of data to the memory array 330. As described above, such commands may be issued via assertion of a signal on the read/write activation signal line 364 and/or in response to assertion of signals by the bank control 332 to the memory array 330 via bank control signal lines 366-1, . . . , 366-N. In some embodiments, the bank control 332 may assert such signals in response to receipt of a signal asserted by the scan control logic 336 via the read/write activation signal line 364.

In some embodiments, the source addresses and destination addresses of scan vectors stored in the memory array 330 may be the same, but located in different banks of the memory array 330. For example, a source address for a scan vector in a first bank (e.g., 331-1) may be the same address as a destination address for a resultant scan vector in a second bank (e.g., 331-N). In some embodiments, the different banks (e.g., Bank A, Bank N, etc.) may share portions of a global data bus to facilitate communication between the banks of the memory array 330. Embodiments are not so limited, however, and the source and destination addresses of scan vectors stored in the memory array 330 may be different and may be located in different banks of the memory array 330.

As described above, the device under test 338 is configured to receive scan vectors during SCAN IN 355, perform a scan chain operation on the scan vector, and output a resultant scan vector during SCAN OUT 357. The scan vector may be received from the serializer/de-serializer 334, and the resultant scan vector may be sent back to the serializer/de-serializer 334. In some embodiments, the device under test 338 may include logic (e.g., flip-flops, shift registers, etc.) to be tested during the scan chain operation. The device under test may be any device that is capable of scan insertion. For example, the device under test 338 may be a synchronously clocked device.

In some embodiments, the device under test may be coupled to an external interface via external interface signal line 372. The external interface may be an external DRAM interface and may include, for example, a command bus, address bus, on-die termination, and pins to asserts row address strobe signals, column address strobe signals, activate signals (e.g., ACT signals to activate a row or page of DRAM), column select signals, and/or clock enable signals. The device under test 338 may also be coupled to an external clock signal which may be asserted via XCLK signal line 359. As shown in FIG. 3, XCLK signal line 359 may also be coupled to the serializer/de-serializer 334 and/or scan chain logic 336, and may be configured to pass the asserted external clock signal to serializer/de-serializer 334 and/or the scan chain logic 336.

The device under test 338 may receive a clock signal from the scan control logic 336 via CLK signal line 351. The clock signal may be used to facilitate timing of performance of the scan chain operation by the device under test 338. Further details regarding assertion of the clock signal to control timing of the scan chain operation are described in connection with FIG. 4, herein.

The device under test 338 may receive a scan enable signal from the scan control logic 336 via scan enable signal line 353 to enable a scan chain operation to be performed. As described above, when the scan enable signal is asserted on scan enable signal line 353, the scan control logic 336 may take over control of access of the memory array 330.

In some embodiments, the device under test may send array control signals via array control interface 362. The array control signals asserted via the array control interface 362 may include read/write signals, row address select and/or column address select signals, as well as various activate signals such as activate bank signals and/or activate column signals. The array control signals may be muxed (e.g., by multiplexer 377) scan control signals sent from the scan control logic 336 via scan control signal line 371. In some embodiments, the select line of the multiplexer 377 may be driven with the scan enable signal sent from the scan control logic 336 via scan enable signal line 365 to select between asserting the array control signals or the scan control signals.

Figure 4:
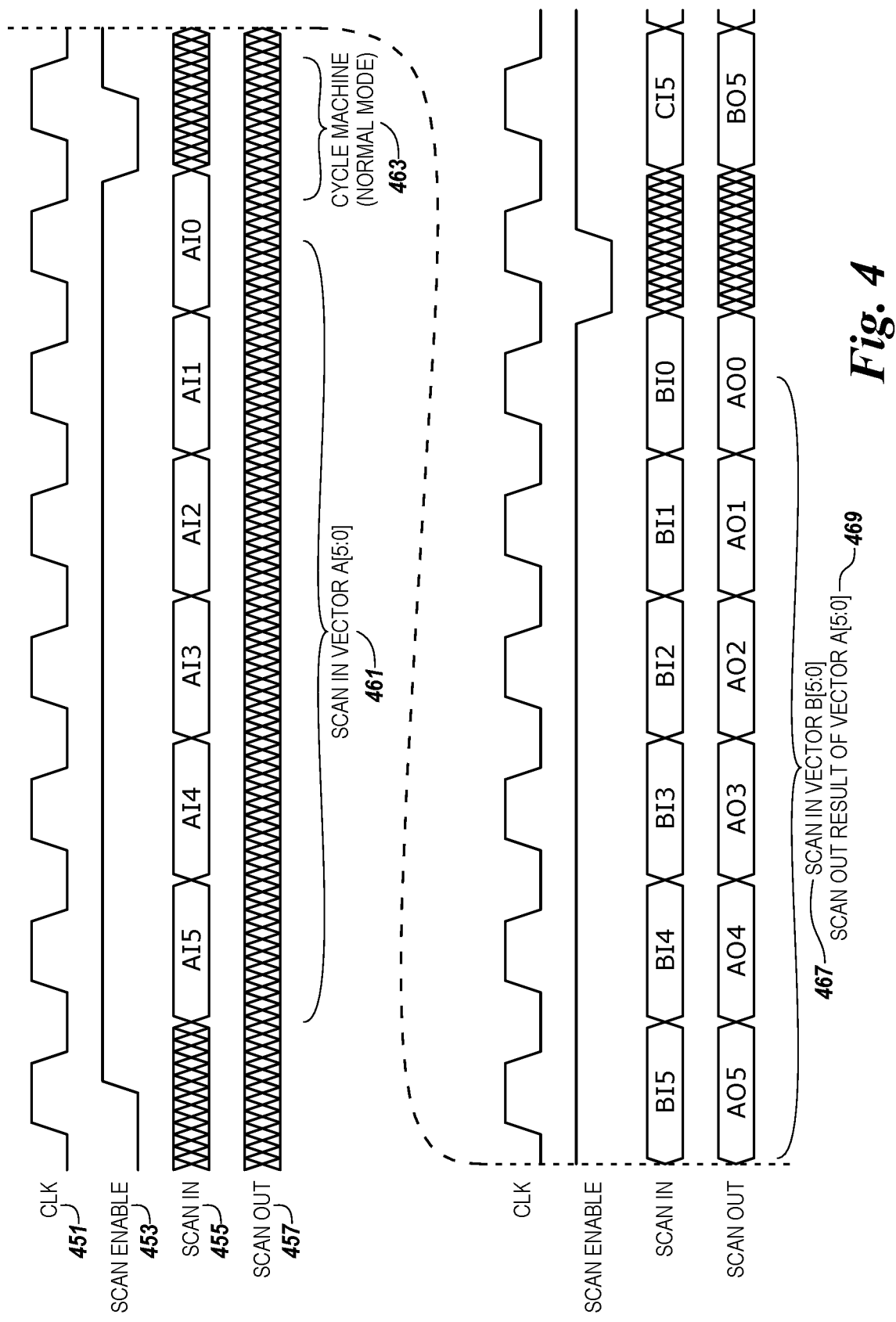
FIG. 4 is a timing diagram for performing scan chain operations in accordance with a number of embodiments of the present disclosure.

FIG. 4 is a timing diagram for performing scan chain operations in accordance with a number of embodiments of the present disclosure. Timing as described in connection with FIG. 4 may be controlled by a controller such as controller 140 illustrated in FIG. 1 or scan control logic 336 illustrated in FIG. 3. The controller can include a clock signal 451, for example, a timing component or timing circuitry in the form of hardware and/or transistor circuitry. Clock signal 451 can be provided to control timing of performing a scan chain operation. In order to initiate a scan chain operation, scan enable signal 453 can be driven to a high state by the controller to scan in signal 455 a scan vector 461. As shown in FIG. 4, the scan in vector 461 (e.g., a first scan in vector) can include a plurality of data values AI5, AI4, AI3, AI2, AI1, and AI0. A second scan in vector is represented by BI5, BI4, BI3, BI2, BI1, BI0, and a third scan in vector is shown starting with CI5. Although 6 data values are shown for the first and second scan in vectors, the number of data values may be greater than or less than 6 data values.

Once the scan vector 461 has been scanned in (e.g., by asserting scan in signal 455) the scan enable signal 453 can be driven low to store (e.g., "capture") the scan vector 461, for example, by providing a clock cycle signal 463. The clock cycle pulse 463 can toggle logic of the scan chain. In at least one embodiment, capturing the scan vector 461 can include exciting the device under test (e.g., device under test 338 illustrated in FIG. 3). In some embodiments, the clock cycle pulse 463 may be a capture pulse.

Following the clock cycle pulse 463, scan enable 453 can be driven high again and a second scan vector 467 can be scanned in (e.g., by asserting scan in signal 455). The resultant scan vector 469 from scan vector 461 can be scanned out (e.g., by asserting scan out signal 457). A first scan out vector is shown in FIG. 4 as AO5, AO4, AO3, AO2, AO1, AO0. In at least one embodiment, resultant scan vector 469 can be scanned out in parallel with second scan vector 467 being scanned in (e.g., by asserting scan in signal 453), as shown at the bottom portion of FIG. 4 where a scan in vector containing data values BI5-BI0 is scanned in parallel with scan out vector containing data values AO5-AO0 being scanned out.

In some embodiments, scan vectors 461 of various lengths can be subjected to scan chain operations. For example, if a scan vector (e.g., second scan vector 467) is longer than a remaining length of a page of DRAM, the scan vector (e.g., second scan vector 467) can be split into one or more portions that are each shorter than a maximum length available to be scanned in. In this example, a next portion of the scan vector can be scanned in (e.g., by asserting scan enable signal 453) in response to completion of a scan chain operation on a previous portion of the scan vector. However, if the length of the scan vector (e.g., scan vector 461) is less than a page size of DRAM, the scan vector may not need to be divided into one or more portions, and the scan chain operation can be completed without fetching additional portions of the scan vector. In at least one embodiment, determining if a scan vector 461 is to be split into one or more portions, and/or coordination of performing scan chain operations on one or more portions of a truncated scan vector 461 is controlled by a controller (e.g., controller 140, scan control logic 336). In some embodiments, a memory tester can be provided to perform scan vector 461 truncation and coordination.

Some embodiments allow for on-die comparison between a resultant scan vector 469 and an expected result vector. In at least one embodiment, compression can be implemented in the memory array (e.g., memory array 130 illustrated in FIG. 1, memory array 330 illustrated in FIG. 3), which can allow for a final pattern read out to be presented as a pass/fail flag. For example, the sensing circuitry can provide ample elements to perform a comparison of the resultant scan vector 469 to a base set of expected data and/or to perform compression computations to reduce a size of the resultant scan vector 469.

In some embodiments, an example procedure for performing scan chain operations can include writing one or more input scan vectors and/or expected output vectors to DRAM. In some embodiments, applying an XNOR operation to the output scan vector 469 and the expected output vector can compress the result such that the final result can be stored as a single bit (e.g., a pass/fail flag).

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a device under test; and
   scan control logic coupled to the device under test, the scan control logic comprising:
   an interface to provide communication with a memory array; and
   a state machine to determine a row of data stored in the memory array to be used as a scan vector,
   wherein the device under test is configured to:
   perform a scan chain operation on the scan vector responsive to receipt of a scan chain control signal, and
   send a resultant output scan vector to a serializer/de-serializer coupled to the device under test, the scan control logic, and the memory array.

2. The apparatus of claim 1, wherein the serializer/de-serializer is further configured to send the resultant output scan vector to the memory array.

3. The apparatus of claim 1, wherein the memory array comprises:
   a first memory bank to:
   store the scan vector; and
   control sending the scan vector to a serializer/de-serializer coupled to the memory array and the scan control logic; and
   a second memory bank to receive a resultant output scan vector from the serializer/de-serializer in response to completion of the scan chain operation.

4. The apparatus of claim 1, wherein the scan control logic is configured to control access to the memory array responsive to initiation of the scan chain control signal.

5. The apparatus of claim 1, wherein the scan control logic is configured to issue column commands to the memory array to cause the scan vector to be read from a first memory bank of the array and resultant output scan vectors to be written to a second memory bank of the array.

6. The apparatus of claim 1, further comprising timing control circuitry to send the scan chain control signal to the device under test.

7. An apparatus, comprising:
   a memory array comprising a plurality of memory banks and coupled to a serializer/de-serializer;
   scan control logic coupled to the serializer/de-serializer and a device under test, the scan control logic comprising logic configured to:
   determine data stored in the memory array to be used as a scan vector; and
   send a scan chain control signal to the device under test to cause the device under test to perform a scan chain operation using the scan vector.

8. The apparatus of claim 7, wherein the scan control logic further comprises a register to track a bit of the scan vector that is being read from the memory array, a bit of the scan vector that is being scanned into the device under test, a bit of the scan vector that is being scanned out of the device under test, or combinations thereof.

9. The apparatus of claim 7, wherein the logic comprises a state machine configured to cause the scan vector to be transferred from the memory array to the device under test.

10. The apparatus of claim 7, wherein the logic comprises a state machine configured to cause a resultant output scan vector to be transferred to the serializer/de-serializer.

11. The apparatus of claim 7, wherein the scan control logic further comprises timing control circuitry, and wherein a state machine is further configured to cause the timing control circuitry to generate the scan chain control signal.

12. The apparatus of claim 7, wherein the serializer/de-serializer is further configured to cause a resultant output scan vector to be transferred to the memory array.

13. The apparatus of claim 7, wherein logic comprises a state machine configured to: cause the scan vector to be read from a first memory bank of the memory array; and
   cause a resultant output scan vector to be written to a second memory bank of the memory array.

14. A method, comprising:
   determining, by control logic coupled to a device under test, data stored in a memory array to be used as a scan vector;
   receiving, by the device under test, a scan chain control signal;
   performing a scan chain operation on the scan vector in response to receipt of the scan chain control signal; and
   transferring a resultant output scan vector to a serializer/de-serializer coupled to the device under test.

15. The method of claim 14, wherein receiving the scan chain control signal further comprises receiving the scan chain control signal from timing control circuitry coupled to the device under test.

16. The method of claim 14, further comprising transferring, by the serializer/de-serialized the resultant output scan vector to the memory array.

17. The method of claim 14, further comprising issuing a command to the memory array to cause the scan vector to be read from a first memory bank of the array and a resultant output scan vector to be written to a second memory bank of the array.

18. The method of claim 14, further comprising receiving, by the device under test, the scan vector via a native datapath of the memory array.

19. An apparatus, comprising:
   a device under test; and
   scan control logic coupled to the device under test, the scan control logic comprising:
   an interface to provide communication with a memory array; and
   a state machine to determine a row of data stored in the memory array to be used as a scan vector,
   wherein the device under test is configured to perform a scan chain operation on the scan vector responsive to receipt of a scan chain control signal, and
   wherein the memory array comprises:
   a first memory bank to:
   store the scan vector; and
   control sending the scan vector to a serializer/de-serializer coupled to the memory array and the scan control logic; and
   a second memory bank to receive a resultant output scan vector from the serializer/de-serializer in response to completion of the scan chain operation.

20. An apparatus, comprising:
   a device under test; and
   scan control logic coupled to the device under test, the scan control logic comprising:
   an interface to provide communication with a memory array; and
   a state machine to determine a row of data stored in the memory array to be used as a scan vector,
   wherein the device under test is configured to perform a scan chain operation on the scan vector responsive to receipt of a scan chain control signal, and
   wherein the scan control logic is configured to issue column commands to the memory array to cause the scan vector to be read from a first memory bank of the array and resultant output scan vectors to be written to a second memory bank of the array.

21. A method, comprising:

determining, by control logic coupled to a device under test, data stored in a memory array to be used as a scan vector;

receiving, by the device under test, a scan chain control signal;

performing a scan chain operation on the scan vector in response to receipt of the scan chain control signal; and issuing a command to the memory array to cause the scan vector to be read from a first memory bank of the array and a resultant output scan vector to be written to a second memory bank of the array.

* * * * *